(12) United States Patent
Seol et al.

(10) Patent No.: US 10,133,176 B2
(45) Date of Patent: Nov. 20, 2018

(54) HARDMASK COMPOSITION AND METHOD OF FORMING PATTERN USING THE SAME

(71) Applicant: Samsung Electronics Co., Ltd., Suwon-si, Gyeonggi-do (KR)

(72) Inventors: Minsu Seol, Suwon-si (KR); Sangwon Kim, Seoul (KR); Hyeonjin Shin, Suwon-si (KR); Seongjun Park, Seoul (KR); Yeonchoo Cho, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/825,792

(22) Filed: Aug. 13, 2015

(65) Prior Publication Data

US 2016/0282721 A1 Sep. 29, 2016

(30) Foreign Application Priority Data

Mar. 24, 2015 (KR) .................. 10-2015-0040963

(51) Int. Cl.
*G03F 7/11* (2006.01)
*G03F 7/09* (2006.01)

(52) U.S. Cl.
CPC ................... *G03F 7/094* (2013.01)

(58) Field of Classification Search
CPC ......... H01L 21/02115; H01L 21/02282; H01L 21/0332; H01L 21/31144
See application file for complete search history.

(56) References Cited

U.S. PATENT DOCUMENTS

| | | | |
|---|---|---|---|
| 4,550,015 | A | 10/1985 | Korb et al. |
| 4,679,054 | A | 7/1987 | Yoshikawa et al. |
| 5,432,227 | A | 7/1995 | Fujimura |
| 6,120,858 | A | 9/2000 | Hirano et al. |
| 7,658,969 | B2 | 2/2010 | Kumar et al. |
| 7,803,715 | B1 | 9/2010 | Haimson et al. |
| 8,008,095 | B2 | 8/2011 | Assefa et al. |
| 8,071,485 | B2 | 12/2011 | Lee et al. |
| 8,258,346 | B2 | 9/2012 | Rajendran |
| 8,524,594 | B2 | 9/2013 | Horikoshi |
| 8,664,439 | B2 | 3/2014 | Lee et al. |

(Continued)

FOREIGN PATENT DOCUMENTS

| | | |
|---|---|---|
| CN | 102774824 A | 11/2012 |
| CN | 102775786 A | 11/2012 |

(Continued)

OTHER PUBLICATIONS

Zhang, et al. "Fabrication of highly oriented reduced graphene oxide microbelts array for massive production of sensitive ammonia gas sensor," Journal of Micromechanics and Microengineering, vol. 23, pp. 1-8 (2013).

(Continued)

*Primary Examiner* — Jaehwan Oh
(74) *Attorney, Agent, or Firm* — Harness, Dickey & Pierce, P.L.C.

(57) ABSTRACT

A hardmask composition includes a plurality of graphene nanosheets doped with boron (B) and/or nitrogen (N) and a solvent. A size of the graphene nanosheet may be in a range of about 5 nm to about 1000 nm. The hardmask composition may include an aromatic ring-containing material.

12 Claims, 5 Drawing Sheets

(56) References Cited

U.S. PATENT DOCUMENTS

| | | | |
|---|---|---|---|
| 8,871,639 B2 | 10/2014 | Chien et al. | |
| 9,018,776 B2 | 4/2015 | Song et al. | |
| 9,583,358 B2 | 2/2017 | Kim et al. | |
| 2002/0051931 A1 | 5/2002 | Mori et al. | |
| 2003/0203314 A1 | 10/2003 | Sebald et al. | |
| 2005/0250052 A1 | 11/2005 | Nguyen | |
| 2007/0026682 A1 | 2/2007 | Hochberg et al. | |
| 2007/0148557 A1 | 6/2007 | Takei et al. | |
| 2008/0032176 A1 | 2/2008 | Shimizu et al. | |
| 2009/0011204 A1* | 1/2009 | Wang | B82Y 30/00 428/215 |
| 2009/0140350 A1 | 6/2009 | Zhu | |
| 2009/0297784 A1 | 12/2009 | Xu et al. | |
| 2010/0055464 A1* | 3/2010 | Sung | B01J 21/18 428/408 |
| 2010/0086463 A1 | 4/2010 | Rudhard et al. | |
| 2010/0218801 A1* | 9/2010 | Sung | B82Y 30/00 136/244 |
| 2010/0316950 A1 | 12/2010 | Oguro et al. | |
| 2011/0014111 A1 | 1/2011 | Leugers et al. | |
| 2011/0210282 A1 | 9/2011 | Foley | |
| 2011/0244142 A1 | 10/2011 | Cheng et al. | |
| 2012/0153511 A1 | 6/2012 | Song et al. | |
| 2012/0181507 A1 | 7/2012 | Dimitrakopoulos et al. | |
| 2012/0193610 A1* | 8/2012 | Kim | B82Y 30/00 257/26 |
| 2012/0245058 A1 | 9/2012 | Monteiro | |
| 2013/0011630 A1 | 1/2013 | Sullivan et al. | |
| 2013/0119350 A1 | 5/2013 | Dimitrakopoulos et al. | |
| 2013/0133925 A1 | 5/2013 | Kim et al. | |
| 2013/0203198 A1 | 8/2013 | Min et al. | |
| 2013/0236715 A1 | 9/2013 | Zhamu et al. | |
| 2013/0313523 A1 | 11/2013 | Yun et al. | |
| 2014/0015000 A1 | 1/2014 | Nishiyama et al. | |
| 2014/0098458 A1* | 4/2014 | Almadhoun | C08K 9/02 361/305 |
| 2014/0183701 A1 | 7/2014 | Choi et al. | |
| 2014/0186777 A1 | 7/2014 | Lee et al. | |
| 2014/0187035 A1 | 7/2014 | Posseme et al. | |
| 2014/0239462 A1 | 8/2014 | Shamma et al. | |
| 2014/0299841 A1 | 10/2014 | Nourbakhsh et al. | |
| 2014/0320959 A1* | 10/2014 | Jun | G02B 27/22 359/464 |
| 2014/0342273 A1 | 11/2014 | Kim et al. | |
| 2015/0001178 A1 | 1/2015 | Song et al. | |
| 2015/0004531 A1 | 1/2015 | Choi et al. | |
| 2015/0008212 A1 | 1/2015 | Choi et al. | |
| 2015/0030968 A1* | 1/2015 | Schwab | C01B 31/0476 429/532 |
| 2015/0056394 A1 | 2/2015 | Rawls | |
| 2015/0064904 A1 | 3/2015 | Yao et al. | |
| 2015/0129809 A1 | 5/2015 | Gauthy et al. | |
| 2015/0137077 A1 | 5/2015 | Yun et al. | |
| 2015/0200090 A1 | 7/2015 | Chada et al. | |
| 2015/0200091 A1 | 7/2015 | Chada et al. | |
| 2015/0307730 A1 | 10/2015 | Hersam et al. | |
| 2015/0348794 A1 | 12/2015 | Kim et al. | |
| 2015/0376014 A1 | 12/2015 | Cesareo et al. | |
| 2015/0377824 A1* | 12/2015 | Ruhl | G01N 27/127 204/424 |
| 2016/0005625 A1 | 1/2016 | Shin et al. | |
| 2016/0011511 A1 | 1/2016 | Shin et al. | |
| 2016/0027645 A1 | 1/2016 | Shin et al. | |
| 2016/0043384 A1* | 2/2016 | Zhamu | H01M 4/133 429/231.4 |
| 2016/0130151 A1* | 5/2016 | Kurungot | H01M 4/96 502/180 |
| 2016/0152748 A1 | 6/2016 | Goffredi et al. | |
| 2016/0179005 A1 | 6/2016 | Shamma et al. | |
| 2016/0211142 A1* | 7/2016 | Kim | H01L 21/02115 |
| 2016/0225991 A1* | 8/2016 | Schwab | C23C 16/26 |
| 2016/0240841 A1* | 8/2016 | He | H01M 4/366 |
| 2016/0282721 A1 | 9/2016 | Seol et al. | |
| 2016/0284811 A1* | 9/2016 | Yu | H01L 29/454 |
| 2016/0291472 A1 | 10/2016 | Shin et al. | |
| 2016/0346769 A1* | 12/2016 | Kim | H01M 4/366 |
| 2016/0369149 A1* | 12/2016 | Liu | C09D 7/62 |
| 2017/0040178 A1 | 2/2017 | Kim et al. | |

FOREIGN PATENT DOCUMENTS

| | | |
|---|---|---|
| EP | 1703328 A1 | 9/2006 |
| EP | 2950334 A1 | 12/2015 |
| JP | 4488234 B2 | 4/2010 |
| JP | 4531400 B2 | 6/2010 |
| JP | 2013-208881 A | 10/2013 |
| KR | 10-1057218 B1 | 8/2011 |
| KR | 20110138611 A | 12/2011 |
| KR | 10-2012-0024756 A | 3/2012 |
| KR | 101114131 B1 | 3/2012 |
| KR | 10-1257694 B1 | 4/2013 |
| KR | 20130062924 A | 6/2013 |
| KR | 10-1343014 B1 | 12/2013 |
| KR | 20130132103 A | 12/2013 |
| KR | 10-1423171 B1 | 7/2014 |
| KR | 101439030 B1 | 9/2014 |
| WO | WO-2013/100365 A1 | 7/2013 |
| WO | WO-2014/135455 A1 | 9/2014 |

OTHER PUBLICATIONS

Hwang, et al. "Transparent actuator made with few layer graphene electrode and dielectric elastomer, for variable focus lens," Applied Physics Letters, vol. 103, pp. 023106-1-023106-5 (2013).

Huang, et al. "An innovative way of etching MoS2: Characterization and mechanistic investigation," Nano Research, vol. 6, No. 3, pp. 200-207 (2013).

Extended European Search Report dated Aug. 17, 2016 issued in corresponding European Application No. 15193939.4.

Song et al, "Highly Efficient Light-Emitting Diode of Graphene Quantum Dots Fabricated from Graphite Intercalation Compounds", Advanced Optical Materials, pp. 1-8, (2014).

Wang et al., "Gram-scale synthesis of single-crystalline graphene quantum dots with superior optical properties", Macmillan Publishers Limited, pp. 1-9 (2014).

Shin et al., "Mass Production of Graphene Quantun Dots by One-Pot Synthesis Directly from Graphite in High Yield", Smalljournal.com, vol. 10, No. 5, pp. 866-870 (2014).

Office Action dated May 8, 2017 in co-pending U.S. Appl. No. 14/843,003.

U.S. Office Action dated Dec. 5, 2017 issued in co-pending U.S. Appl. No. 15/611,935.

U.S. Notice of Allowance dated Nov. 3, 2017 issued in co-pending U.S. Appl. No. 14/791,912.

U.S. Notice of Allowance dated Aug. 28, 2017 issued in co-pending U.S. Appl. No. 14/791,912.

U.S. Office Action dated Jun. 13, 2017 issued in co-pending U.S. Appl. No. 14/791,912.

U.S. Office Action dated Feb. 8, 2017 issued in co-pending U.S. Appl. No. 14/791,912.

U.S. Office Action dated May 10, 2016 issued in co-pending U.S. Appl. No. 14/791,912.

U.S. Office Action dated Aug. 16, 2016 issued in co-pending U.S. Appl. No. 14/791,912.

U.S. Notice of Allowance dated Oct. 19, 2016 issued in co-pending U.S. Appl. No. 14/725,390.

U.S. Office Action dated Mar. 22, 2016 issued in co-pending U.S. Appl. No. 14/725,390.

U.S. Notice of Allowance dated Mar. 15, 2017 issued in co-pending U.S. Appl. No. 14/697,150.

U.S. Office Action dated Sep. 30, 2016 issued in co-pending U.S. Appl. No. 14/697,150.

U.S. Office Action dated Mar. 28, 2016 issued in co-pending U.S. Appl. No. 14/697,150.

U.S. Office Action dated Oct. 6, 2017 issued in co-pending U.S. Appl. No. 14/843,003.

"Silane Coupling Agents," Xiameter for Dow Corning, Silicones Simplified, pp. 1-7 (2009).

(56) References Cited

OTHER PUBLICATIONS

Wang, et al. "Gram-scale synthesis of single-crystalline graphene quantum dots with superior optical properties," Nature Communications, Macmillian Publishers Limited, pp. 1-9 (2014).

Shin, et al. "Mass Production of Graphene Quantum Dots by One-Pot Synthesis Directly from Graphite in High Yield," small-journal.com, vol. 10, No. 5, pp. 866-870 (2014).

Nazarov "Functionalization and dispersion of h-BN nanosheets treated with inorganic reagents," Chemistry, An Asian Journal, vol. 7, Issue 3, pp. 1-6 (2012).

Hascik, et al. "Dry etching of carbon layers in various etch gases," Vacuum, vol. 58, pp. 434-439 (2000).

Grenadier, et al. "Dry etching techniques for active devices based on hexagonal boron nitride epilayers," Journal of Vacuum Science & Technology A, vol. 31, pp. 061517-061517.3 (2013).

European Search Report dated Sep. 30, 2015 issued in corresponding European Application No. 15169702.6.

U.S. Office Action dated Feb. 21, 2018 issued in co-pending U.S. Appl. No. 15/332,287.

U.S. Notice of Allowance dated Feb. 1, 2018 issued in co-pending U.S. Appl. No. 14/791,912.

U.S. Notice of Allowance dated Mar. 27, 2018 issued in co-pending U.S. Appl. No. 15/611,935.

U.S. Appl. No. 14/791,912, filed Jul. 6, 2015.

U.S. Appl. No. 15/332,287, filed Oct. 24, 2016.

U.S. Appl. No. 14/843,003, filed Sep. 2, 2015.

U.S. Appl. No. 15/611,935, filed Jun. 2, 2017.

U.S. Office Action dated May 22, 2018 issued in copending U.S. Appl. No. 14/843,003.

U.S. Notice of Allowance dated Jul. 20, 2018 issued in copending U.S. Appl. No. 15/611,935.

U.S. Office Action dated Aug. 10, 2018 issued in co-pending U.S. Appl. No. 14/791,912.

U.S. Notice of Allowance dated Aug. 9, 2018 issued in co-pending U.S. Appl. No. 15/332,287.

\* cited by examiner

HARDMASK COMPOSITION AND METHOD OF FORMING PATTERN USING THE SAME

CROSS-REFERENCE TO RELATED APPLICATION

This application claims the benefit of Korean Patent Application No. 10-2015-0040963, filed on Mar. 24, 2015, in the Korean Intellectual Property Office, the disclosure of which is incorporated herein in its entirety by reference.

BACKGROUND

1. Field

Example embodiments relate to a hardmask composition including boron (B)-doped and/or nitrogen (N)-doped graphene nanosheets and a method of forming a pattern using the hardmask composition.

2. Description of the Related Art

The semiconductor industry has demanded a technique for providing an ultra-fine pattern having a size of several to several tens of nanometers. In order to manufacture the ultra-fine pattern, effective lithographic techniques are required. A typical lithographic technique includes providing an etching layer on a semiconductor substrate, coating a photoresist layer on the etching layer, exposing and developing the photoresist layer to provide a photoresist pattern, and etching the etching layer using the photoresist pattern as a mask.

As a size of the pattern to be formed is minimized or reduced, providing a fine pattern having a desirable profile using the typical lithographic technique described above may be difficult. Accordingly, a hardmask layer may be formed between the etching layer, which is to be etched, and the photoresist layer to provide a fine pattern. The hardmask serves as an interlayer that transfers the fine pattern of the photoresist to the etching layer through a selective etching process. Thus, the hardmask layer needs to have chemical resistance, thermal resistance, and etching resistance in order to tolerate etching processes.

As semiconductor devices have become highly integrated, a height of an etching layer is maintained the same or has increased, although a line-width of the etching layer has gradually narrowed. Thus, an aspect ratio of the etching layer has increased. Because an etching process needs to be performed under such conditions, the heights of a photoresist layer and a hardmask pattern also need to be increased. However, increasing the heights of the photoresist layer and the hardmask pattern is limited. In addition, the hardmask pattern may be damaged during the etching process for obtaining an etching layer with a narrow line-width, and thus electrical characteristics of devices may deteriorate.

In this regard, a method has been suggested to use a single layer or multiple layers formed of an insulating material or a conductive material including a polysilicon layer, a tungsten layer, and a nitride layer. However, the method using the single layer or the multiple layers requires a relatively high deposition temperature, and thus physical properties of the etching layer may be changed.

SUMMARY

Example embodiments provide a hardmask composition having improved stability and etching-resistance.

Example embodiments provide a method of forming a pattern using the hardmask composition.

Additional aspects will be set forth in part in the description which follows and, in part, will be apparent from the description, or may be learned by practice of the presented example embodiments.

According to example embodiments, a hardmask composition includes a plurality of B-doped and/or N-doped graphene nanosheets and a solvent.

According to example embodiments, a method of forming a pattern includes forming an etching layer on a substrate, providing a hardmask composition on the etching layer to form a hardmask, the hardmask composition including a plurality of B-doped and/or N-doped graphene nanosheets and a solvent, forming a photoresist layer on the hardmask, forming a hardmask pattern by patterning the hardmask using the photoresist layer as an etching mask, and etching the etching layer using the hardmask pattern as an etching mask.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1A:
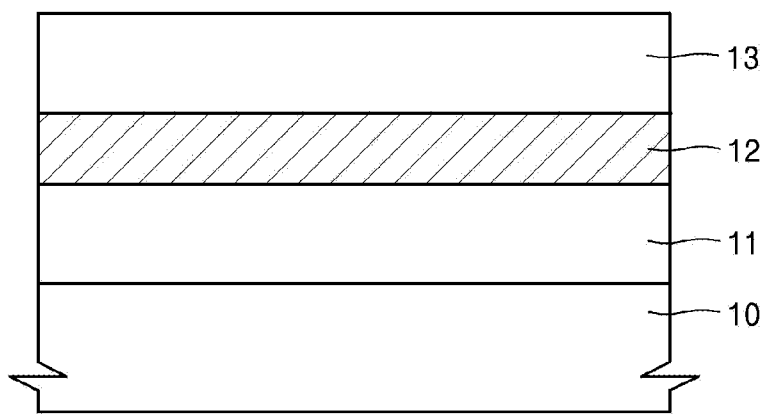
FIGS. 1A to 1E sequentially illustrate a method of forming a pattern using a hardmask composition according to example embodiments.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items). Expressions such as "at least one of," when preceding a list of elements, modify the entire list of elements and do not modify the individual elements of the list.

Sizes of components in the drawings may be exaggerated for convenience of explanation. In other words, because sizes and thicknesses of layers or regions in the drawings are arbitrarily illustrated for convenience of explanation, the following embodiments are not limited thereto.

It will be understood that when a component, such as a layer or a region, is referred to as being "on" another component, the component can be directly on the other component or intervening components may be present thereon.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises", "includes", "including" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to example embodiments, a hardmask composition includes a plurality of B-dopes and/or N-doped graphene nanosheets and a solvent, wherein each of the graphene nanosheets has a size in a range of about 5 nm to about 1000 nm. Hereinafter, the B-doped and/or N-doped graphene nanosheet is also referred to as "graphene nanosheet".

The graphene nanosheet may have a 2-dimensional plate-like structure or a sphere-like structure. For example, the graphene nanosheet may have a sphere-like structure. Here, the term "sphere-like" may include any shape that is substantially close to a shape of sphere. For example, the sphere-like shape may include sphere and oval.

When the graphene nanosheet is in a sphere shape, the term "size" may refer to an average particle diameter of the graphene nanosheet. When the graphene nanosheet has a plate-like structure, the term "size" may refer to a diameter of the 2-dimensional structure. When the graphene nanosheet has an oval shape, the term "size" may refer to a longitudinal diameter.

A size of the graphene nanosheet may be in a range of about 5 nm to about 1000 nm, for example, about 5 nm to about 100 nm. The graphene nanosheet may include a plurality of graphene layers. The number of layers of the graphene nanosheet may be 1500 or less, for example, 300 layers or less. When a size, the number of layers, and a thickness of the graphene nanosheet are within these ranges, the hardmask composition may have improved stability.

The graphene nanosheet includes edge carbon (edge C) that exists at an edge site and a center carbon (center C) that exists at a center site. The center carbon has a $sp^2$ binding structure, and the edge carbon has a $sp^2$ or $sp^3$ binding structure. The edge carbon may have a $sp^3$ binding structure in which hydrogen or a functional group, e.g., oxygen, is bonded, and thus reactivity with respect to an etching solution is higher than that of the center carbon.

When a size of the graphene nanosheet is 5 nm or less, an amount of the edge carbon may be greater than 20 atom % based on the total amount of carbon in the graphene nanosheet, and thus an etching rate of a hardmask formed using the hardmask composition may be undesirably fast. Also, when a size of the graphene nanosheet is greater than 1000 nm, an etching rate of the hardmask may be appropriately controlled, but dispersibility of the graphene nanosheet in the hardmask composition may decrease.

The graphene nanosheet is doped with B and/or N. An amount of B and/or N may be in a range of about 1 atom % to about 35 atom % of the graphene nanosheet. B and/or N doped in the graphene nanosheet mostly bonds to an edge of the graphene nanosheet and is charged which improves interaction with a solvent. In this regard, when a solvent is added, a dispersibility of the graphene sheet is improved.

Also, the graphene nanosheet has an improved etching resistance with respect to an etching gas due to a relatively high bond dissociation energy.

The hardmask including the B- and/or N-doped graphene nanosheet has a band gap generated by the doping, and thus have an improved transmittance at a wavelength region of about 633 nm than that of the graphene nanosheet without the doping. In this regard, when the hardmask with an improved transmittance is used, an align mark for patterning a hardmask pattern and an etching layer may be more easily detected, and thus patterning of an etching layer having a fine pattern size may be accomplished.

A value of k of the B- and/or N-doped graphene nanosheet included in the hardmask at a wavelength of about 633 nm is about 1.0 or lower, for example, 0.5, or, for example, about 0.1 or lower. For comparison, k of graphite is in a range of about 1.3 to about 1.5, and k of graphene, which is formed of a $sp^2$ bonding structure only, is in a range of about 1.1 to about 1.3.

The value of k is an extinction coefficient which is measured using a spectroscopic ellipsometry method. When k is low, a transmittance is high, and when k of the graphene nanosheet is within the range above, the hardmask including the graphene nanosheet is used, the align mark may be more easily detected.

The B- and/or N-doped graphene nanosheet is comprised of a polycyclic aromatic molecule, which is formed by a plurality of carbon atoms that are linked by a covalent bond, where the carbon atoms linked by a covalent bond may include a 6-membered ring, or, for example, a 5-membered ring and/or a 7-membered ring, as a basic repeating unit. As a result, the graphene nanosheet may appear as a single layer of the carbon atoms linked by a covalent bond (generally, a $sp^2$ bond). The graphene may be formed as a single layer or as multiple layers that is formed by stacking a plurality of layers, where the multiple layers of the graphene may have 300 layers or less, or, for example, 1 layer to 100 layers.

The graphene nanosheet includes boron atoms, nitrogen atoms, and some oxygen atoms, in addition to carbon atoms, rather than having a fully conjugated C=C/C—C structure.

The graphene nanosheet has an improved solvent dispersibility, and thus the hardmask composition having desirable stability is more easily prepared using the graphene nanosheet. Also, when the hardmask composition includes the graphene nanosheet, etching resistance of the hardmask composition with respect to an etching gas may be improved.

At least one functional group selected from the group consisting of a hydroxyl group, an epoxy group, a carboxyl group, and a carbonyl group, in addition to boron, nitrogen, and oxygen, may be bonded to a terminal of the graphene nanosheet. Boron and nitrogen bond to the terminal of the graphene nanosheet in place of oxygen or the functional group, and because boron and nitrogen forms a stable structure, chemical tolerance of the hardmask composition including the graphene nanosheet may increase.

An amount of the graphene nanosheet may be in a range of about 0.1 wt % to about 40 wt % based on the total weight of the hardmask composition. When the amount of the graphene nanosheet is within this range, the hardmask composition including the graphene nanosheet may have desirable stability and improved etching resistance.

In Raman spectrum analysis, the graphene nanosheet has peaks observed at about 1340 $cm^{-1}$ to about 1350 $cm^{-1}$, about 1580 $cm^{-1}$, and about 2700 $cm^{-1}$. The peaks provide information of a thickness, a crystallinity, and a doping status of the graphene nanosheet. The peak observed at about 1580 cm-1 is a "G mode" peak, which is generated by a vibration mode corresponding to stretching of a carbon-carbon bond. Energy of the "G mode" is determined by a density of excess charge doped in the graphene nanosheet. Also, the peak observed at about 2700 $cm^{-1}$ is a "2D mode" peak that is useful in the evaluation of a thickness of the graphene nanosheet. The peak observed at about 1340 $cm^{-1}$ to about 1350 $cm^{-1}$ was a "D mode" peak, which appears when a $sp^2$ crystal structure has defects and is mainly observed when many defects are found around edges of the graphene nanosheet. Also, a ratio of a D peak intensity to a G peak intensity (an D/G intensity ratio) provides information of a degree of disorder of crystals of the graphene nanosheet.

An intensity ratio ($I_D/I_G$) of a D mode peak to a G mode peak obtained from Raman spectroscopy analysis of the graphene nanosheet is 2 or lower. For example, the intensity ratio ($I_D/I_G$) is within a range of about 0.001 to about 2.0.

An intensity ratio ($I_{2D}/I_G$) of a 2D mode peak to a G mode peak obtained from Raman spectroscopy analysis of the graphene nanosheet is 0.01 or higher. For example, the intensity ratio ($I_{2D}/I_G$) is within a range of about 0.01 to about 1.0, or, for example, about 0.05 to about 0.5.

When the intensity ratio of a D mode peak to a G mode peak and the intensity ratio of a 2D mode peak to a G mode peak are within the ranges above, the graphene nanosheet may have a relatively high crystallinity and a relatively small defect, and thus a bonding energy increases so that a hardmask prepared using the graphene nanosheet may have improved etching resistance.

X-ray diffraction analysis using CuKα is performed on the graphene nanosheet, and as the result of the X-ray analysis, the graphene nanosheet may include a 2-dimensional layered structure having a (002) crystal surface peak. The (002) crystal surface peak is observed within a range of about 20° to about 27°.

A distance between the graphene layers (d-spacing of the graphene nanosheets) obtained from the X-ray diffraction analysis is in a range of about 0.3 nm to about 0.7 nm, or, for example, about 0.334 nm to about 0.478 nm.

The graphene nanosheet may be formed as a single layer or multiple layers of graphene.

The graphene nanosheet according to example embodiments has a higher content of $sp^2$ carbon bond than that of $sp^3$ carbon bond and a relatively high content of oxygen compared to a conventional amorphous carbon layer. A $sp^2$ carbon bond (that is, a bond of an aromatic structure) has a higher bonding energy than that of a $sp^3$ carbon bond.

The $sp^3$ structure is a 3-dimensional bonding structure of diamond having a tetrahedral shape, and the $sp^2$ structure is a 2-dimensional bonding structure of graphite in which a carbon to hydrogen ratio (a C/H ratio) increases and thus may secure resistance to dry etching.

In the graphene nanosheet, a $sp^2$ carbon bond fraction is equal to or greater than a $sp^3$ carbon bond fraction. For example, the $sp^2$ carbon bond fraction is a multiple of a $sp^3$ carbon bond fraction by about 1.0 to about 10, or by about 1.88 to about 3.42.

An amount of the $sp^2$ carbon atom bonding structure is about 30 atom % or more, or, for example, about 39.7 atom % to about 62.5 atom %, in the C1s XPS analysis. Due to the mixing ratio, bond breakage of the graphene nanosheet may be difficult because carbon-carbon bond energy is high. Also, B and/or N mostly bond to the edge of the graphene nanosheet, and thus etching resistance of the graphene nanosheet improves.

Thus, when a hardmask composition including the graphene nanosheet is used, etching resistance characteristics during the etching process may improve. Also, a bond strength between the hardmask and adjacent layers may increase.

A hardmask obtained using conventional amorphous carbon mainly includes a $sp^2$ carbon atom binding structure and thus may have improved etching resistance. However, the hardmask has a relatively low transparency, thus, may cause a problem of alignment, and particles may be generated during a deposition process of the hardmask, and thus a hardmask manufactured using a diamond-like carbon having a $sp^3$-carbon atom binding structure has been developed. However, this hardmask has relatively low etching resistance and thus is limited in applying to the process.

A k value of graphite is in a range of about 1.3 to about 1.5, and a k value of graphene formed of a $sp^2$ structure is in a range of about 1.1 to about 1.3. A k value of the graphene nanosheet according to example embodiments is about 1.0 or less, or, for example, in a range of about 0.1 to about 0.5, and thus the graphene nanosheet has desirable transparency. Accordingly, when the hardmask including the graphene nanosheet is used, an align mark may be more easily recognized during formation of a pattern on an etching layer, and thus finer and uniform pattern may be obtained, and the hardmask may have improved etching resistance.

The solvent in the hardmask composition according to example embodiments may be any solvent that may disperse the graphene nanosheet. Examples of the solvent may include water, an alcohol-based solvent, and an organic solvent.

Examples of the alcohol-based solvent may include methanol, ethanol, and isopropanol, and examples of the organic solvent may include N,N-dimethylformamide, N-methylpyrrolidone, dichloroethane, dichlorobenzene, N,N-dimethylsulfoxide, xylene, aniline, propylene glycol, propylene glycol diacetate, methoxypropanediol, diethyleneglycol, gamma-butyrolactone, acetylacetone, cyclohexanone, propylene glycol monomethyl ether acetate, γ-butyrolactone, dichloroethane, O-dichlorobenzene, nitromethane, tetrahydrofuran, nitromethane, dimethyl sulfoxide, nitrobenzene, butyl nitrite, methylcellosolve, ethylcellosolve, diethylether, diethyleneglycolmethylether, diethyleneglycolethylether, dipropyleneglycolmethylether, toluene, hexane, methylethylketone, methylisoketone, hydroxymethylcellulose, and heptane.

An amount of the solvent may be about 120 parts to about 10,000 parts by weight based on 100 parts by weight of the total weight of the graphene nanosheet. When an amount of the solvent is within this range, the hardmask composition may have an appropriate viscosity and thus may more easily form a layer.

The hardmask composition may further include a first material, which is at least one selected from an aromatic ring-containing monomer and a polymer that includes a plurality of aromatic ring-containing monomers. The material including an aromatic ring increases fluidity of the hardmask composition, and thus a coating layer may be more easily formed.

The aromatic ring-containing monomer is at least one selected from the group consisting of a monomer represented by Formula 1 and a monomer represented by Formula 2:

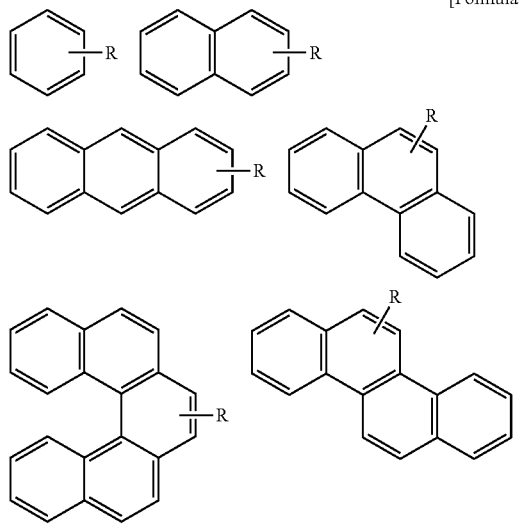

[Formula 1]

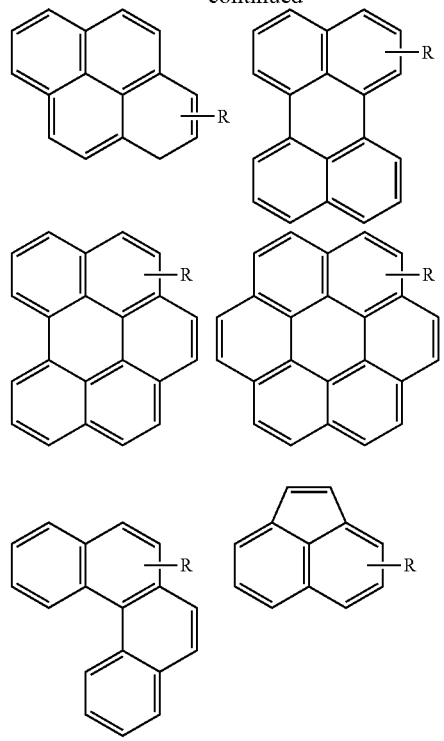

-continued

In Formula 1, R is a mono-substituted or a multi-substituted substituent that is at least one selected from the group consisting of a hydrogen atom, a halogen atom, a hydroxyl group, an isocyanate group, a glycidyloxy group, a carboxyl group, an aldehyde group, an amino group, a siloxane group, an epoxy group, an imino group, an urethane group, an ester group, an epoxy group, an amide group, an imide group, an acryl group, a methacryl group, a substituted or unsubstituted $C_1$-$C_{30}$ saturated organic group, and a substituted or unsubstituted $C_1$-$C_{30}$ unsaturated organic group.

R may be a general photosensitive functional group instead of the groups listed above.

The $C_1$-$C_{30}$ saturated organic group and the $C_1$-$C_{30}$ unsaturated organic group may have a photosensitive functional group. Here, examples of the photosensitive functional group may be an epoxy group, an amide group, an imide group, an urethane group, and an aldehyde group.

Examples of the $C_1$-$C_{30}$ saturated organic group and the $C_1$-$C_{30}$ unsaturated organic group may be a substituted or unsubstituted $C_1$-$C_{30}$ alkyl group, a substituted or unsubstituted $C_1$-$C_{30}$ alkoxy group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroaryloxy group, a substituted or unsubstituted $C_4$-$C_{30}$ carbon-ring group, a substituted or unsubstituted $C_4$-$C_{30}$ carbon-ring oxy group, and a substituted or unsubstituted $C_2$-$C_{30}$ hetero-ring group.

In Formula 1, a binding site of R is not limited. Also, the number of R in Formula 1 is one for convenience of description, but R may be substituted to at any site where every substitution is possible.

A-L-A' [Formula 2]

In Formula 2, each of A and A' are identical to or different from each other and are independently a monovalent organic group derived from one selected from the monomers represented by Formula 1; and L is a single bond including one of a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_7$-$C_{30}$ arylenealkylene group, a substituted or unsubstituted $C_6$-$C_{30}$ arylene group, a substituted or unsubstituted $C_2$-$C_{30}$ heteroarylene group, a substituted or unsubstituted $C_2$-$C_{30}$ heteroarylenealkylene group, a substituted or unsubstituted $C_1$-$C_{30}$ alkyleneoxy group, a substituted or unsubstituted $C_7$-$C_{30}$ arylenealkyleneoxy group, a substituted or unsubstituted $C_6$-$C_{30}$ aryleneoxy group, a substituted or unsubstituted $C_2$-$C_{30}$ heteroaryleneoxy group, a substituted or unsubstituted $C_2$-$C_{30}$ heteroarylenealkyleneoxy group, —C(=O)—, and —SO$_2$—.

In L, the substituted $C_1$-$C_{30}$ alkylene group, substituted $C_2$-$C_{30}$ alkenylene group, substituted $C_2$-$C_{30}$ alkynylene group, substituted $C_7$-$C_{30}$ arylenealkylene group, substituted $C_6$-$C_{30}$ arylene group, substituted $C_2$-$C_{30}$ heteroarylene group, substituted $C_2$-$C_{30}$ heteroarylenealkylene group, substituted $C_1$-$C_{30}$ alkyleneoxy group, substituted $C_7$-$C_{30}$ arylenealkyleneoxy group, substituted $C_6$-$C_{30}$ aryleneoxy group, substituted $C_2$-$C_{30}$ heteroaryleneoxy group, and substituted $C_2$-$C_{30}$ heteroarylenealkyleneoxy group may be substituted with a substituent selected from a halogen atom, a hydroxyl group, an isocyanate group, a glycidyloxy group, a carboxyl group, an aldehyde group, an amino group, a siloxane group, an epoxy group, an imino group, an urethane group, an ester group, an epoxy group, an amide group, an imide group, an acryl group, and a methacryl group.

The substituted $C_1$-$C_{30}$ alkylene group, substituted $C_2$-$C_{30}$ alkenylene group, substituted $C_2$-$C_{30}$ alkynylene group, substituted $C_7$-$C_{30}$ arylenealkylene group, substituted $C_6$-$C_{30}$ arylene group, substituted $C_2$-$C_{30}$ heteroarylene group, substituted $C_2$-$C_{30}$ heteroarylenealkylene group, substituted $C_1$-$C_{30}$ alkyleneoxy group, substituted $C_7$-$C_{30}$ arylenealkyleneoxy group, substituted $C_6$-$C_{30}$ aryleneoxy group, substituted $C_2$-$C_{30}$ heteroaryleneoxy group, and substituted $C_2$-$C_{30}$ heteroarylenealkyleneoxy group may be substituted with a photosensitive functional group.

The first material is at least one selected from the group consisting of a compound represented by Formula 3 and a compound represented by Formula 4:

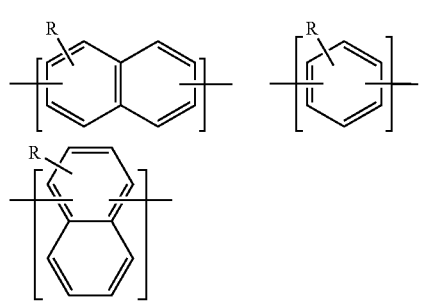

[Formula 3]

In Formula 3, R is as defined in the description of Formula 1.

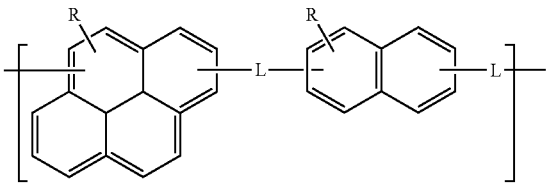

[Formula 4]

In Formula 4, R is as defined in the description of Formula 1; and

L is as defined in the description of Formula 2.

In Formulae 3 and 4 above, a binding site of R is not limited, and the number of R in Formulae 3 and 4 above is one for convenience of description, but R may be substituted to at any site where every substitution is possible.

An average molecular weight of the polymer containing a repeating unit including an aromatic ring-containing monomer is about 300 to about 30,000. When a polymer having an average molecular weight within this range is used, a thin film may be more easily formed, and a transparent hardmask may be manufactured.

The first material may be a compound represented by Formula 5:

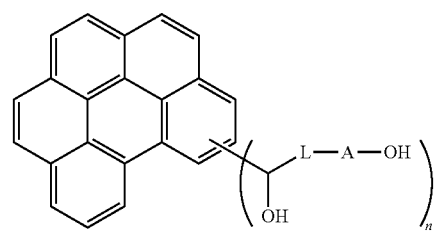

[Formula 5]

In Formula 5, A is a substituted or unsubstituted $C_6$ to $C_{30}$ arylene group;

L is a single bond or a substituted or unsubstituted $C_1$ to $C_6$ alkylene group; and n is an integer of 1 to 5.

The arylene group is one selected from groups of Group 1:

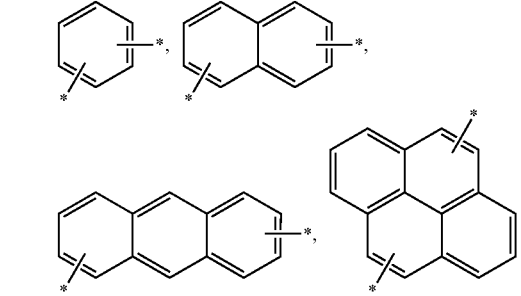

[Group 1]

The compound of Formula 5 may be represented by Formulae 6a to 6c:

[Formula 6a]

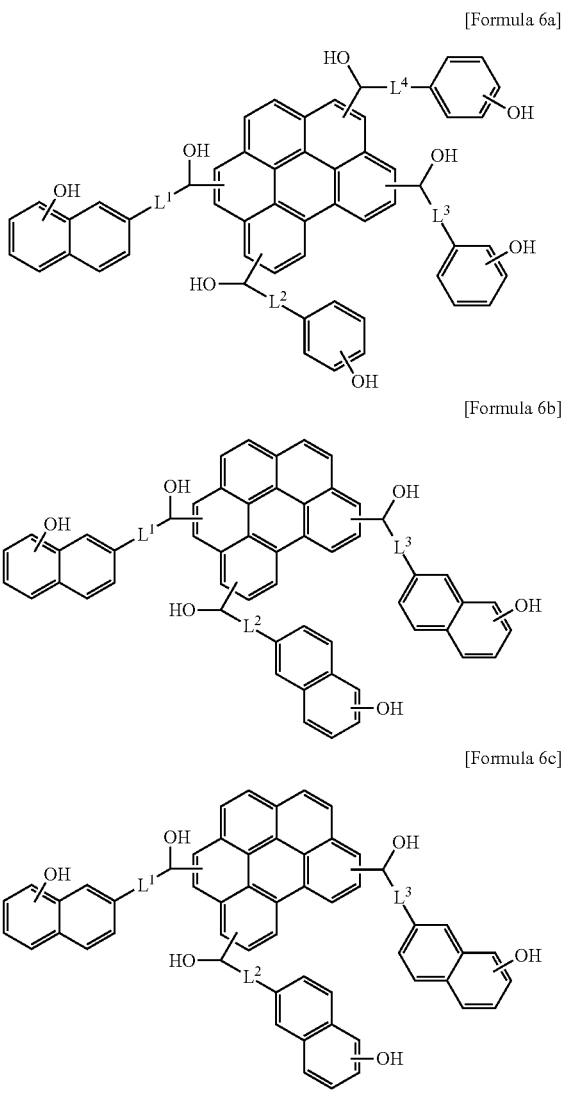

[Formula 6b]

[Formula 6c]

In Formula 6a, 6b, or 6c, each of $L^1$ to $L^4$ are independently one of a single bond and a substituted or unsubstituted $C_1$ to $C_6$ alkylene group.

The first material is selected from compounds represented by Formulae 6d to 6f:

[Formula 6d]

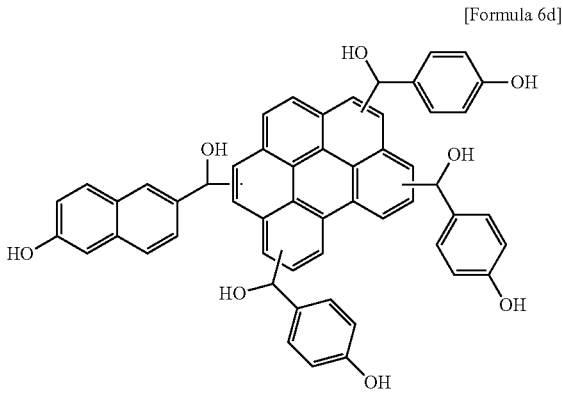

[Formula 6e]

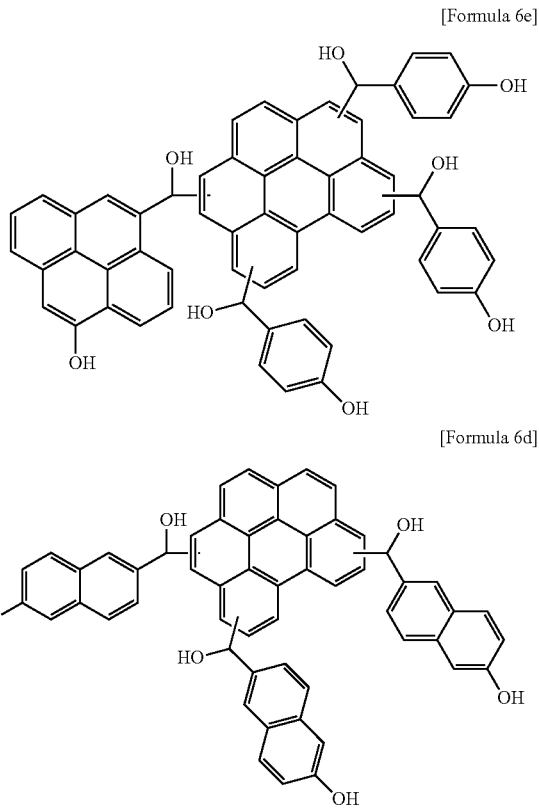

[Formula 6d]

The first material may be a co-polymer represented by Formula 7:

[Formula 7]

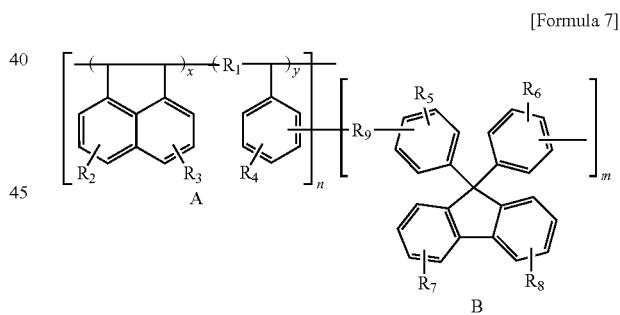

In Formula 7, $R_1$ is a $C_1$-$C_4$ substituted or unsubstituted alkylene group; each of $R_2$, $R_3$, $R_7$, and $R_8$ are independently one of a hydrogen atom, a hydroxyl group, a linear, branched or cyclic $C_1$-$C_{10}$ alkyl group, an alkoxy group, a $C_6$-$C_{30}$ aryl group, and a mixture thereof; each of $R_4$, $R_5$, and $R_6$ are independently one of a hydrogen atom, a hydroxyl group, a $C_1$-$C_4$ alkylether group, a phenyldialkylene ether group, and a mixture thereof; $R_9$ is one of an alkylene group, a phenyldialkylene group, a hydroxyphenylalkylene group, and a mixture thereof; each of x and y are independently a mole fraction of two repeating units in part A which is about 0 to about 1, where x+y=1; n is an integer of 1 to 200; and m is an integer of 1 to 200.

The first material is a polymer represented by Formula 7a, Formula 7b, or Formula 7c:

[Formula 7a]

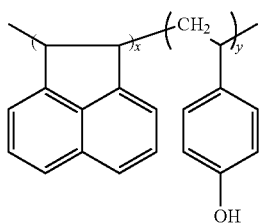

In Formula 7a, x is 0.2, and y is 0.8.

[Formula 7b]

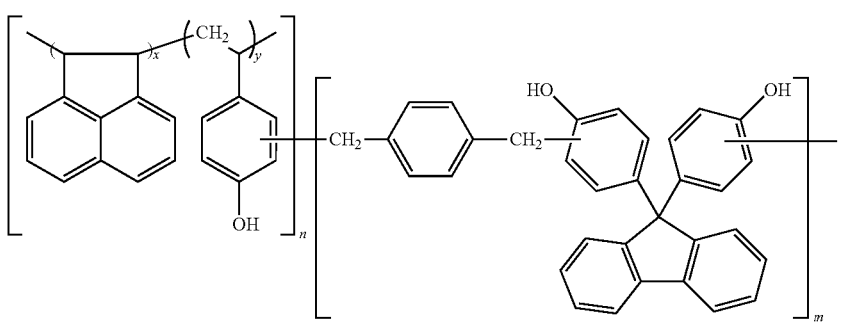

In Formula 7b, x is 0.2, y is 0.8, n=90, and m=10.

[Formula 7c]

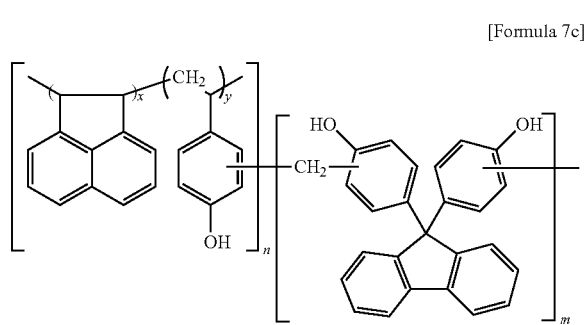

In Formula 7c, x is 0.2, y is 0.8, n=90, and m=10.

The first material may be a copolymer represented by Formula 8 or Formula 9:

In Formulae 8 and 9, each of m and n are independently an integer of 1 to 190; $R_1$ is one of a hydrogen (—H), a hydroxyl group (—OH), a $C_1$-$C_{10}$ alkyl group, a $C_6$-$C_{10}$ aryl group, an allyl group, and a halogen atom; $R_2$ is one of a group represented by Formula 9A, a phenyl group, a chrysene, a pyrene, a fluoroanthene, an anthrone, a benzophenone, a thioxanthone, an anthracene, and their derivatives; $R_3$ is a conjugated diene; and $R_4$ is an unsaturated dienophile.

[Formula 9A]

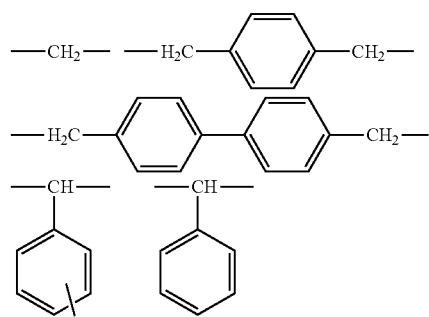

In Formula 9A, $R_3$ is 1,3-butadienyl group or a 1,6-cyclopentadienylmethyl, and $R_4$ is a vinyl group or a cyclopentenylmethyl group.

[Formula 8]

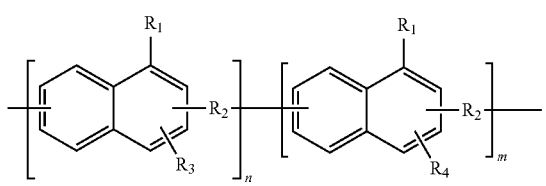

[Formula 9]

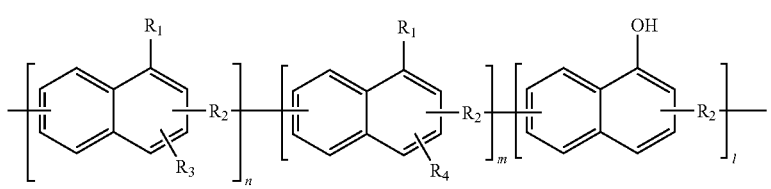

The copolymer may be a polymer represented by one of Formulae 10 to 13:

[Formula 10]

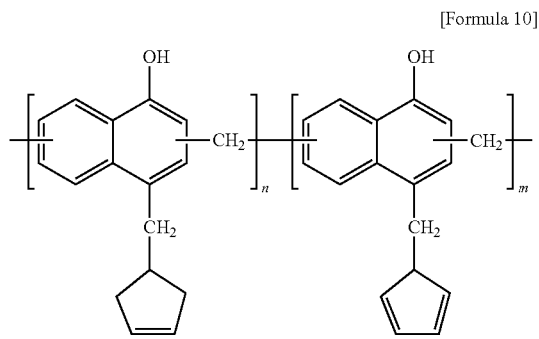

In Formula 10, m+n=21 (where, the polymer has an average molecular weight (Mw)=10,000 and a polydispersity=2.1).

[Formula 11]

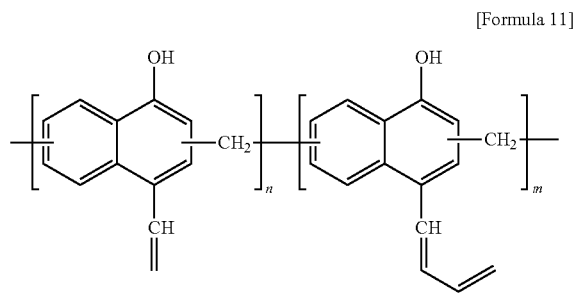

In Formula 11, an average molecular weight of the polymer is about 11,000, and a polydispersity of the polymer is about 2.1.

[Formula 12]

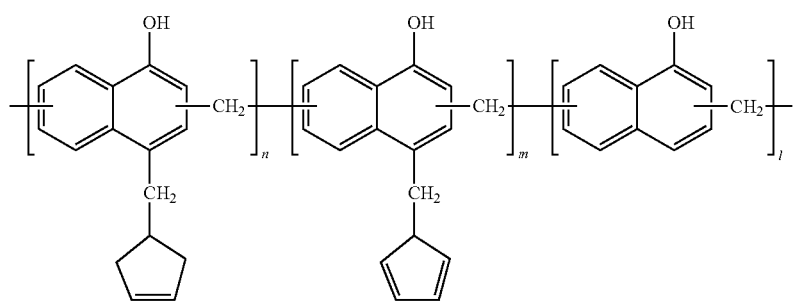

In Formula 12, an average molecular weight of the polymer is about 10,000, and a polydispersity of the polymer is about 1.9, where l+m+n=21 and n+m:l=2:1.

[Formula 13]

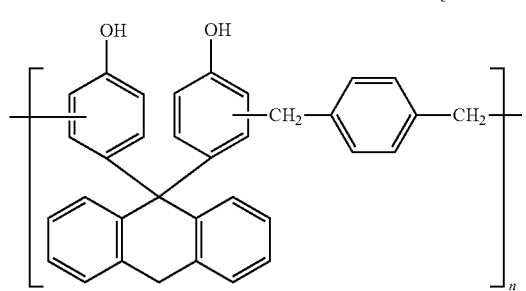

In Formula 13, an average molecular weight (Mw) of the polymer is about 10,000; a polydispersity of the polymer is 2.0, where n is about 20.

The graphene nanosheet has a relatively low reactivity with respect to a $C_xF_y$ gas which is an etching gas used to etch an etching layer, e.g., $SiO_2$ or SiN, thus increasing an etching resistance. Also, $SF_6$ or $XeF_6$, which is an etching gas that has relatively low reactivity with respect to $SiO_2$ and SiNx, has a desirable etching rate on the graphene nanosheet, thus ashing of the graphene nanosheet may be more easily performed. In addition, the graphene nanosheet, which is a material having a band gap, has desirable transparency, and thus the process using the hardmask including the graphene nanosheet may be more easily performed without an additional align mask.

Hereinafter, a method of preparing a hardmask using the hardmask composition according to example embodiments will be described in detail.

The hardmask composition according to example embodiments contains a graphene nanosheet and a solvent.

The hardmask composition has improved stability.

A heat-treating process may be performed during or after the process of coating an etching layer with the hardmask composition. Conditions for the heat-treating process may vary depending on a material of the etching layer, but a temperature of the heat-treating process may be from room temperature (about 20° C. to about 25° C.) to about 1500° C.

The heat-treating process is performed in an inert gas atmosphere or in vacuum.

A heating source of the heat-treating process may be induction heating, radiant heat, lasers, infrared rays, microwaves, plasma, ultraviolet rays, or surface plasmon heating.

The inert gas atmosphere may be prepared by mixing a nitrogen gas and/or an argon gas.

After the heat-treating process, the solvent may be removed, and a c-axis aligning process of graphene may be performed. The resultant, from which the solvent is removed, may be baked at a temperature of about 400° C. or less, or, for example, from about 100° C. to about 400° C., and then another heat-treating process may be performed on the baked resultant at a temperature of about 800° C. or less, or, for example, from about 400° C. to about 800° C.

The hardmask may be prepared without undergoing the baking process but only through the heat-treating process.

When the temperatures of the heat-treating process and the baking process are within these ranges above, the hardmasks with improved etching resistance may be prepared.

A temperature increasing rate in the heat-treating process and the baking process is about 1° C./min to about 1000° C./min. When a temperature increasing rate is within this range, the deposited layer may not be damaged due to a rapid temperature change, and thus a process efficiency may be improved.

A thickness of the hardmask may be in a range of about 10 nm to about 10,000 nm.

Hereinafter, a method of preparing a B-doped and/or N-doped graphene nanosheet will be described.

A carbon precursor, a boron precursor, and a nitrogen precursor are supplied into an autoclave with a metal catalyst powder to form graphene on the metal catalyst powder. Here, boron and nitrogen in the boron precursor and the nitrogen precursor bind with graphene, and thus the graphene is doped with boron and nitrogen. The reaction may be performed in a nitrogen atmosphere instead of a nitrogen precursor. For example, $CCl_4$, $BBr_3$, and a potassium powder are added to the autoclave and reacted in the nitrogen atmosphere. A surface of the potassium powder is covered with carbon in a graphene structure, and the boron and nitrogen substitute carbon at an edge of the graphene. The boron and nitrogen may substitute oxygen or another functional group bonded to the edge of the graphene.

The resultant may be washed with HCl, acetone, or DI water to remove metal impurities and dried to obtain a B/N-doped graphene nanosheet.

Alternatively, a graphene oxide dispersion solution, a boron precursor, and a nitrogen precursor may be provided to an autoclave. $NH_3BH_3$ may be used as the boron precursor and the nitrogen precursor. A temperature of the autoclave may be maintained at about 180° C., and the mixture in the autoclave may be allowed to react for about 12 hours.

The resultant may be washed with HCl, acetone, or DI water to remove metal impurities and dried to obtain a B/N-doped graphene nanosheet.

Hereinafter a method of forming a pattern using the hardmask composition according to example embodiments will be described by referring to FIGS. 1A to 1E.

Referring to FIG. 1A, an etching layer 11 is formed on a substrate 10. A hardmask 12 is formed on the etching layer 11 by providing the hardmask composition including a B-doped and/or N-doped graphene nanosheet and a solvent. The hardmask 12 may include a first material which includes an aromatic ring-containing monomer or a polymer including a repeating unit including an aromatic ring-containing monomer, or a mixture thereof. The hardmask composition may be heat-treated during the providing the hardmask composition or after the providing the hardmask composition.

A process for providing the hardmask composition may be performed by one method selected from spin coating, air spraying, electrospraying, dip coating, spray coating, doctor blade coating, and bar coating.

The hardmask composition may be provided using a spin-on coating method. Here, the hardmask composition may coat the substrate 10 at a thickness of, for example, in a range of about 10 nm to about 10,000 nm, but the thickness of the hard composition is not limited thereto.

A material forming the substrate 10 is not particularly limited, but the substrate 10 may be one selected from, for example, a Si substrate; a glass substrate; a GaN substrate; a silica substrate; a substrate including at least one selected from nickel (Ni), cobalt (Co), iron (Fe), platinum (Pt), palladium (Pd), gold (Au), aluminum (Al), chromium (Cr), copper (Cu), manganese (Mn), molybdenum (Mo), rhodium (Rh), iridium (Ir), tantalum (Ta), titanium (Ti), tungsten (W), uranium (U), vanadium (V), and zirconium (Zr); and a polymer substrate.

The etching layer 11 is formed of a material that is to be patterned ultimately, and the etching layer 11 may be, for example, a metal (e.g., aluminum or copper), a semiconductor, e.g., silicon, or an insulator, e.g., silicon oxide or silicon nitride. The etching layer 11 may be formed using various methods, e.g., sputtering, electronic beam deposition, chemical vapor deposition, and physical vapor deposition. For example, the etching layer 11 may be formed using a chemical vapor deposition method.

A photoresist layer 13 is formed on the hardmask 12.

Figure 1B:
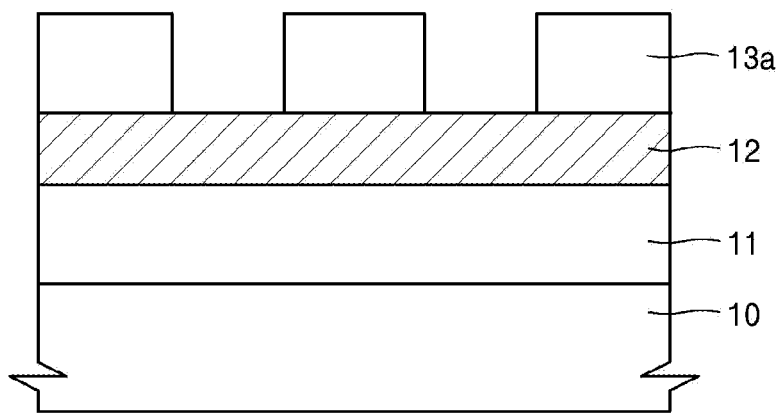

Referring to FIG. 1B, a photoresist pattern 13a is formed by exposing and developing the photoresist layer 13 using a common lithographic technique.

The process of exposing the photoresist layer 13 may be performed using, for example, ArF, KrF, or EUV. Also, the photoresist pattern 13a may be heat-treated at a temperature in a range of about 200° C. to about 500° C. after the exposing process.

A developing solution, e.g., a tetramethyl ammonium hydroxide (TMAH) aqueous solution, may be used for the developing process.

Figure 1C:
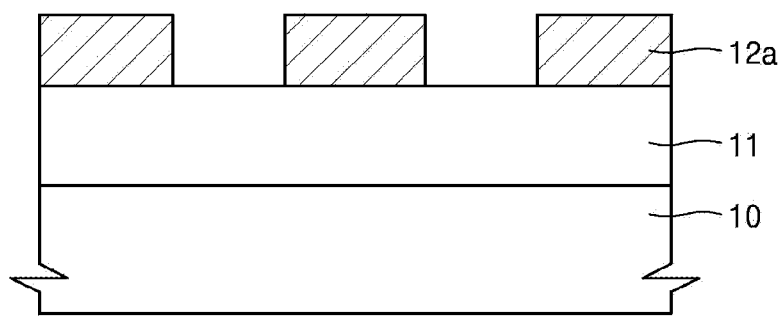

Referring to FIG. 1C, a hardmask pattern 12a is formed on the etching layer 11 by etching the hardmask 12 using the photoresist pattern 13a as an etching mask.

A thickness of the hardmask pattern 12a may be in a range of about 10 nm to about 10,000 nm. When a thickness of the hardmask pattern 12a is within this range, the hardmask pattern 12a may have an uniform shape and an improved etching resistance.

The etching process may be performed using a dry etching method using an etching gas. The etching gas may be at least one selected from $CF_4$, $CHF_3$, $Cl_2$, and $BCl_3$.

The etching gas may be a mixture gas of $C_4F_8$ and $CHF_3$, an a mixing ratio of $C_4F_8$ to $CHF_3$ may be in a range of about 1:10 to about 10:1 at a volume ratio.

Figure 1D:
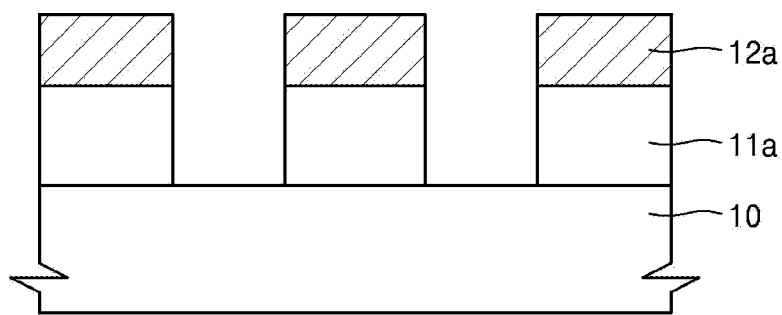

Referring to FIG. 1D, an etching layer pattern 11a having a desired fine pattern is formed by etching the etching layer 11 using the hardmask pattern 12a as an etching mask.

Figure 1E:
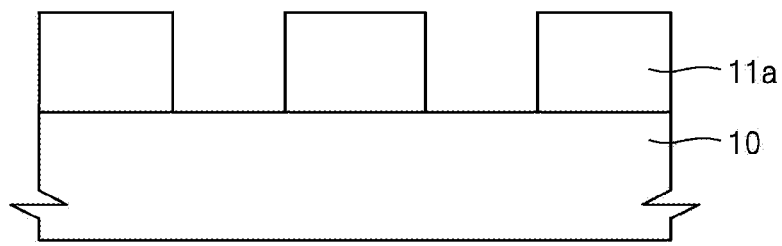

Referring to FIG. 1E, the hardmask pattern 12a is removed by $O_2$ ashing. The hardmask pattern 12a formed of the B/N-doped graphene nanosheet may be more easily removed by ashing compared to general graphene without B/N doping. The hardmask pattern 12a may be removed using a wet strip process. The wet strip process may be performed using, for example, alcohol, acetone, or a mixture of nitric acid and sulfuric acid.

The hardmask according to example embodiments may be used as an etching mask or as a stopper in the manufacture of a semiconductor device by being inserted between other layers.

Hereinafter, a method of forming a pattern using a hardmask composition according to example embodiments will be described by referring to FIGS. 2A to 2D.

Figure 2A:
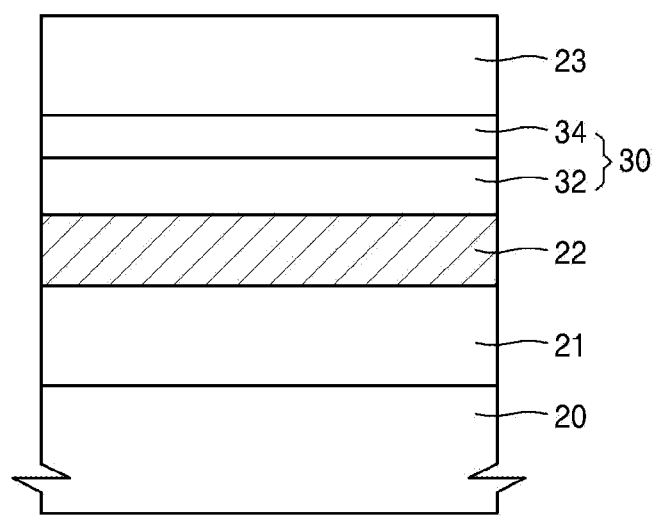
FIGS. 2A to 2D sequentially illustrate a method of forming a pattern using a hardmask composition according to example embodiments.

Referring to FIG. 2A, an etching layer 21 is formed on a substrate 20. The substrate 20 may be a silicon substrate.

The etching layer 21 may be, for example, a silicon oxide layer, a silicon nitride layer, a silicon oxynitride layer, or a silicon carbide (SiC) layer.

A hardmask composition may be provided on the etching layer 21 to form a hardmask 22.

An anti-reflection layer 30 is formed on the hardmask 22. Here, the anti-reflection layer 30 may include an inorganic anti-reflection layer, an organic anti-reflection layer, or a combination thereof. In example embodiments, the anti-reflection layer 30 includes an inorganic anti-reflection layer 32 and an organic anti-reflection layer 34.

The inorganic anti-reflection layer 32 may be, for example, a SiON layer, and the organic anti-reflection layer 34 may be a polymer layer commonly used in the art having an appropriate refraction index and a relatively high absorption coefficient with respect to a photoresist in a wavelength of the exposing.

A thickness of the anti-reflection layer 30 may be, for example, in a range of about 100 nm to about 500 nm.

A photoresist layer 23 is formed on the anti-reflection layer 30.

Figure 2B:
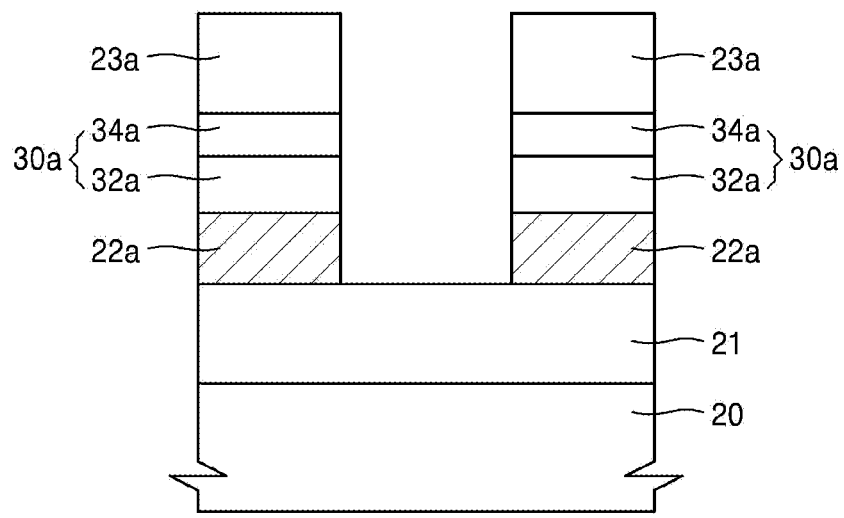

Referring to FIG. 2B, the photoresist layer 23 is exposed to light and developed using a common lithography technique to form a photoresist pattern 23a. Then, the anti-reflection layer 30 and the hardmask 22 are sequentially etched using the photoresist pattern 23a as an etching mask to form an anti-reflection layer pattern 30a and a hardmask pattern 22a on the etching layer 21. The anti-reflection layer pattern 30a includes an inorganic anti-reflection layer pattern 32a and an organic anti-reflection layer pattern 34a.

FIG. 2B illustrates that the photoresist pattern 23a and the anti-reflection layer pattern 30a remain after forming the hardmask pattern 22a, but, in some embodiments, part of or the whole photoresist pattern 23a and the anti-reflection layer pattern 30a may be removed during the etching process for forming the hardmask pattern 22a.

Figure 2C:
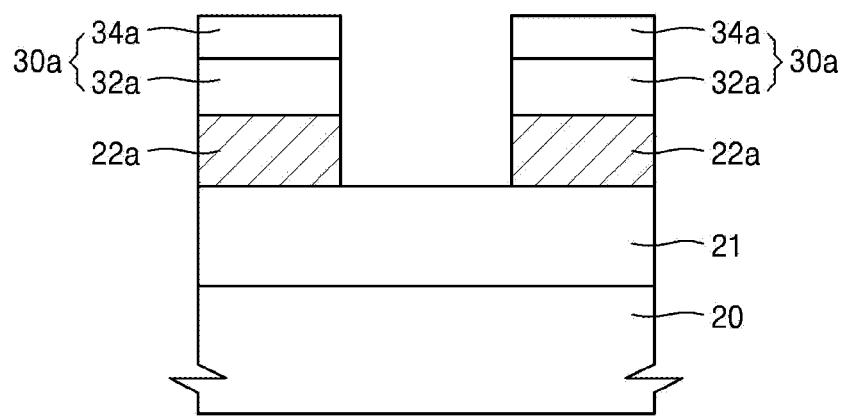

FIG. 2C illustrates that only the photoresist pattern 23a is removed.

Figure 2D:
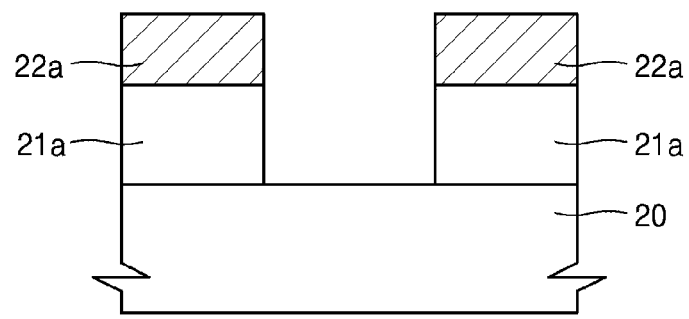

Referring to FIG. 2D, the etching layer 21 is etched using the hardmask pattern 22a as an etching mask to form an etching layer pattern 21a.

After forming the etching layer pattern 21a, the hardmask pattern 22a is removed. In the preparation of the hardmask pattern according to example embodiments, the hardmask pattern 22a may be more easily removed using a common method in the art, and almost no residue remains after removing the hardmask pattern 22a.

The removing process of the hardmask pattern 22a may be performed by, for example, $O_2$ ashing or wet stripping. For example, the wet stripping may be performed using alcohol, acetone, or a mixture of nitric acid and sulfuric acid.

In the B-doped and/or N-doped graphene nanosheet of the hardmask prepared according to the process described above, an amount of a $sp^2$ carbon bond structure is higher than an amount of $sp^3$ carbon bond structure, and thus sufficient etching resistance for a dry etching process may be secured. Also, the hardmask has improved transparency, and thus an align mark for patterning may be more easily detected.

A pattern formed using the hardmask composition according to example embodiments may be used in the manufacture and design of an integrated circuit device. For example, the pattern may be used in the formation of a patterned etching layer structure, e.g., metal lines, holes for contact or bias, insulation sections (for example, a Damascene Trench (DT) or shallow trench isolation (STI)), or a trench for a capacitor structure.

Thereinafter, example embodiments will be described in detail with reference to the following examples. However, these examples are not intended to limit the scope of the example embodiments.

Preparation Example 1: Preparation of B/N-Doped Graphene Nanosheet 4 mg of $CCl_4$, 7.6 g of potassium, and 0.39 ml of $BBr_3$ were placed in an autoclave vessel, and the autoclave vessel was maintained in a nitrogen atmosphere at a temperature of 270° C. for 30 minutes. As graphene was formed on potassium, which is a catalyst in a powder state, nitrogen or boron bonded to an edge of the graphene, and thus the graphene was doped.

When the reaction was completed, the resultant was washed with HCl, acetone, or DI water to remove a potassium powder and dried to obtain a B/N-doped graphene nanosheet. An average particle diameter of the graphene nanosheet was about 50 nm.

Preparation Example 2: Preparation of Graphene Nanosheet

After providing a graphene oxide dispersion solution and $NH_3BH_3$ in the autoclave, the autoclave was maintained at a temperature of about 180° C. for about 12 hours.

The resultant was washed with HCl, acetone, or DI water to remove impurities and dried to obtain a B/N-doped graphene nanosheet. An average particle diameter of the graphene nanosheet was about 50 nm.

The graphene nanosheets prepared according to Preparation Example 1 and Preparation Example 2 had a structure in which nitrogen, boron, or an oxygen-containing functional group is formed at an edge of the graphene nanosheets.

Example 1

0.5 g of the graphene nanosheet prepared according to Preparation Example 1 was dispersed in 0.1 L of water to obtain a hardmask composition. The hardmask composition was spray-coated on a silicon oxide which is formed on a silicon substrate, and the substrate was heat-treated at a temperature of 200° C. Subsequently, the resultant was baked at a temperature of 400° C. for 1 hour, and thus a hardmask containing a graphene nanosheet having a thickness of about 100 nm was prepared.

An ArF photoresist (PR) was coated on the hardmask at a thickness of 1700 Å and pre-baked at a temperature of about 100° C. for 60 seconds. The hardmask was exposed to light using a light-exposing device available from ASML (XT:1400, NA 0.93), and then the resultant was post-baked at a temperature of about 100° C. for 60 seconds. Subsequently, the hardmask was developed using a tetramethyl ammonium hydroxide (TMAH) 2.38 wt % aqueous solution to form a photoresist pattern.

A dry etching was performed with a $CF_4/CHF_3$ mixture gas using the photoresist pattern as a mask. Conditions for the etching were a chamber pressure of 20 mT, a RF power of 1800 W, $C_4F_8/CHF_3$ (at a volume ratio of 4/10), and a period of time of 120 seconds.

$O_2$ ashing or wet stripping was performed on the hardmask and an organic material remaining after performing the dry etching to obtain a desired silicon substrate having a silicon oxide layer pattern as a final pattern.

Example 2

A silicon substrate having a silicon oxide layer pattern was prepared in the same manner as in Example 1 using the graphene nanosheet prepared according to Preparation Example 2.

Comparative Example 1

A silicon substrate having a silicon oxide pattern is prepared as follows using a hardmask including relatively high temperature-amorphous carbon.

A carbon source ($C_3H_6$) was deposited on the silicon substrate having a silicon oxide thereon to form a hardmask including amorphous carbon.

The deposition was performed by a chemical vapor deposition method at a temperature of about 550° C., a pressure in a range of about 0.01 mTorr to about 1 mTorr, and an ion energy in a range of about 50 eV to about 500 eV.

An ArF photoresist (PR) was coated at a thickness of 1700 Å on the hardmask and pre-baked at a temperature of about 110° C. for 60 seconds. The hardmask was exposed to light using a light-exposing device available from ASML (XT:1400, NA 0.93), and then the resultant was post-baked at a temperature of about 110° C. for 60 seconds. Subsequently, the hardmask was developed using a tetramethyl ammonium hydroxide (TMAH) 2.38 wt % aqueous solution to form a photoresist pattern.

A dry etching was performed with a $CF_4/CHF_3$ mixture gas using the photoresist pattern as a mask. Conditions for the etching included a chamber pressure of 20 mT, a RF power of 1800 W, $C_4F_8/CHF_3$ (at a volume ratio of 4/10), and a period of time of 120 seconds.

$O_2$ ashing or wet stripping was performed on the hardmask and an organic material remaining after performing the dry etching to obtain a desired silicon substrate having a silicon oxide layer pattern as a final pattern.

Comparative Example 2

A silicon oxide pattern was formed using a hardmask including relatively low temperature-amorphous carbon was formed in the same manner as in Comparative Example 1, except that a temperature as a deposition condition of the carbon source ($C_3H_6$) was changed to 300° C. so that the relatively low temperature-amorphous carbon was obtained.

Comparative Example 3

A monomer represented by Formula 1 below was dissolved in a mixed solvent including propylene glycol monomethyl ether acetate (PGMEA), methylpyrrolidone, and gamma-butyrolactone (at a mixing ratio of 40:20:40 (v/v/v)), and filtered to prepare a hardmask composition.

[Formula 1]

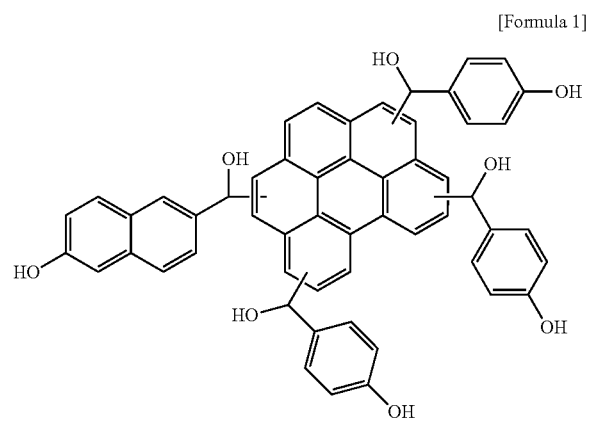

The hardmask composition was thus obtained. A silicon substrate having a silicon oxide thereon was coated with the hardmask composition using a spin-on coating method, and this was heat-treated at a temperature of about 400° C. for about 120 seconds to form a hardmask including spin-on-carbon (SOC).

An ArF photoresist (PR) was coated at a thickness of 1700 Å on the hardmask and pre-baked at a temperature of about 110° C. for 60 seconds. Each of the hardmasks was exposed to light using a light-exposing device available from ASML (XT:1400, NA 0.93), and then the resultant was post-baked at a temperature of about 110° C. for 60 seconds. Subsequently, each of the hardmasks was developed using a tetramethyl ammonium hydroxide (TMAH) 2.38 wt % aqueous solution to form a photoresist pattern.

A dry etching was performed with a $CF_4/CHF_3$ mixture gas using the photoresist pattern as a mask. Conditions for the etching included a chamber pressure of 20 mT, a RF power of 1800 W, $C_4F_8/CHF_3$ (at a volume ratio of 4/10), and a period of time of 120 seconds.

$O_2$ ashing or wet stripping was performed on the hardmask and an organic material remaining after performing the dry etching to obtain a desired silicon substrate having a silicon oxide layer pattern as a final pattern.

Evaluation Example 1: Transmittance

Transmittances of the hardmasks prepared in Examples 1 and 2 and Comparative Examples 1 to 3 were measured at a wavelength of about 633 nm for light-exposure.

As the results of the measurement, it may be confirmed that the transmittances of the hardmask patterns prepared in Examples 1 and 2 were improved compared to the transmittances of the hardmask patterns prepared in Comparative Examples 1 to 3. In this regard, when the hardmask with improved transmittance is used, detection of an align mark for patterning a hardmask pattern and a to-be-etched layer becomes easier, and thus patterning of an etching layer having a relatively fine and compact pattern size may be accomplished.

Evaluation Example 2: Etching Resistance

Thickness differences of the hardmasks and the silicon oxide layers before and after performing a drying etching were measured using the hardmasks prepared in Examples 1 and 2 and Comparative Examples 1 to 3, and etching selection ratios were calculated according to Equation 1 below, and etching resistances of the hardmasks were evaluated.

Etching selection ratio=(thickness of silicon oxide before performing etching−thickness of silicon oxide after performing etching)/(thickness of hardmask before performing etching−thickness of hardmask after performing etching)×100    [Equation 1]

As the results of the evaluation, it was confirmed that the etching selection ratios of the hardmasks prepared in Examples 1 and 2 increased and thus had improved etching resistance compared to those of the hardmasks prepared in Comparative Examples 1 to 3.

As described above, according to example embodiments, a hardmask composition has improved stability and improved etching resistance and chemical stability and increased transparency compared to those of a polymer or amorphous carbon.

When a hardmask includes the hardmask composition, a fine and uniform pattern may be formed, and the hardmask may be utilized in a lithography technique of a semiconductor process.

It should be understood that example embodiments described herein should be considered in a descriptive sense only and not for purposes of limitation. Descriptions of features or aspects within each example embodiment should typically be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. A hardmask composition comprising:
   a plurality of graphene nanosheets, each of the plurality of graphene nanosheets being doped with at least one of boron (B) and nitrogen (N); and
   a solvent,
   wherein a ratio of a weight of the solvent to a weight of the plurality of graphene nanosheets being between about 1.2 to about 100, and
   a ratio of a $sp^2$ carbon bond fraction of each of the plurality of graphene nanosheets to a $sp^3$ carbon bond fraction is in a range of 1.88~3.42.

2. The hardmask composition of claim 1, wherein
   a size of each of the plurality of graphene nanosheets is in a range of about 5 nm to about 1000 nm, and
   each of the plurality of graphene nanosheets includes 300 layers of graphene or less.

3. The hardmask composition of claim 1, wherein each of the plurality of graphene nanosheets includes at least one of the B and N in an amount ranging from about 1 atom % to about 35 atom %.

4. The hardmask composition of claim 1, wherein the plurality of graphene nanosheets has an intensity ratio of a D mode peak to a G mode peak of about 2 or lower as obtained from Raman spectroscopy analysis.

5. The hardmask composition of claim 1, wherein the plurality of graphene nanosheets has an intensity ratio of a 2D mode peak to a G mode peak of about 0.01 or higher as obtained from Raman spectroscopy analysis.

6. The hardmask composition of claim 1, further comprising:
   a first material including one of an aromatic ring-containing monomer, a polymer including an aromatic ring-containing monomer as a repeating unit and a mixture thereof.

7. The hardmask composition of claim 1, wherein an amount of the plurality of graphene nanosheets is in a range of about 0.1 wt % to about 40 wt % based on the total weight of the hardmask composition.

8. The hardmask composition of claim 1, wherein the solvent is at least one of water, methanol, isopropanol, ethanol, N,N-dimethylformamide, N-methylpyrrolidone, dichloroethane, dichlorobenzene, N,N-dimethylsulfoxide, xylene, aniline, propylene glycol, propylene.glycol diacetate, methoxypropanediol, diethyleneglycol, gamma-butyrolactone, acetylacetone, cyclohexanone, propylene glycol monomethyl ether acetate, γ-butyrolactone, dichloroethane, O-dichlorobenzene, nitromethane, tetrahydrofuran, nitromethane, dimethyl sulfoxide, nitrobenzene, butyl nitrite, methylcellosolve, ethylcellosolve, diethylether, diethyleneglycolmethylether, diethyleneglycolethylether, dipropyleneglycolmethylether, toluene, hexane, methylethylketone, methylisoketone, hydroxymethylcellulose, and heptanes.

9. A method of forming a pattern, the method comprising:
   forming an etching layer on a substrate;
   providing a hardmask composition on the etching layer to form a hardmask, the hardmask composition including,
      a plurality of graphene nanosheets, each of the plurality of graphene nanosheets being doped with at least one of boron (B) and nitrogen (N),
      wherein a ratio of a $sp^2$ carbon bond fraction of each of the plurality of graphene nanosheets to a spa carbon bond fraction is in a range of 1.88~3.42 and
      a solvent, wherein a ratio of a weight of the solvent to a weight of the plurality of graphene nanosheets being between about 1.2 to about 100;
   forming a photoresist layer on the hardmask;
   forming a hardmask pattern by patterning the hardmask using the photoresist layer as an etching mask; and
   etching the etching layer using the hardmask pattern as an etching mask.

10. The method of claim 9, further comprising:
    heat-treating the hardmask composition during or after the providing.

11. The method of claim 9, wherein a thickness of the hardmask is in a range of about 10 nm to about 10,000 nm.

12. The method of claim 9, wherein the providing provides the hardmask composition by one of spin coating, air spraying, electrospraying, dip coating, spray coating, doctor blade, and bar coating.

* * * * *